(12) United States Patent
Schmidt et al.

(10) Patent No.: US 11,155,489 B2
(45) Date of Patent: Oct. 26, 2021

(54) COATED WAVELENGTH CONVERTING MATERIAL FOR A LIGHT EMITTING DEVICE

(71) Applicant: Lumileds LLC, San Jose, CA (US)

(72) Inventors: Peter Josef Schmidt, Aachen (DE); Cas Groenendijk, Aachen (DE)

(73) Assignee: Lumileds LLC, San Jose, CA (US)

(*) Notice: Subject to any disclaimer, the term of this patent is extended or adjusted under 35 U.S.C. 154(b) by 185 days.

(21) Appl. No.: 16/254,164

(22) Filed: Jan. 22, 2019

(65) Prior Publication Data
US 2019/0225535 A1 Jul. 25, 2019

(30) Foreign Application Priority Data
Jan. 22, 2018 (EP) .................................. 18152731

(51) Int. Cl.
| | |
|---|---|
| C03C 4/12 | (2006.01) |
| C03C 14/00 | (2006.01) |
| H01L 33/50 | (2010.01) |
| C09K 11/02 | (2006.01) |
| C09K 11/08 | (2006.01) |
| C09K 11/77 | (2006.01) |

(52) U.S. Cl.
CPC .............. *C03C 4/12* (2013.01); *C03C 14/004* (2013.01); *C03C 14/006* (2013.01); *C09K 11/02* (2013.01); *C09K 11/025* (2013.01); *C09K 11/0883* (2013.01); *C09K 11/7734* (2013.01); *H01L 33/501* (2013.01); *H01L 33/502* (2013.01); *C03C 2204/00* (2013.01); *C03C 2214/05* (2013.01); *H01L 2933/0041* (2013.01)

(58) Field of Classification Search
CPC ............ C09K 11/0883; C09K 11/7734; C09K 11/025; C09K 11/02; H01L 33/502; C03C 4/12; C03C 14/004; C03C 14/006; C03C 2204/00; C03C 214/05
See application file for complete search history.

(56) References Cited

U.S. PATENT DOCUMENTS

| | | | |
|---|---|---|---|
| 8,287,759 B2 | 10/2012 | Collins et al. | |
| 9,624,124 B2 | 4/2017 | Aitken et al. | |
| 2008/0180018 A1* | 7/2008 | Minamoto | ............ C03C 14/006 313/483 |
| 2013/0026371 A1 | 1/2013 | Holloway et al. | |
| 2015/0028365 A1 | 1/2015 | Kurtin et al. | |
| 2016/0315231 A1* | 10/2016 | Gootz | ................... H01L 33/504 |

FOREIGN PATENT DOCUMENTS

| | | |
|---|---|---|
| CN | 106833611 A1 | 6/2017 |
| JP | 2006-052345 * | 2/2006 |

OTHER PUBLICATIONS

Translation of JP 2006-052345, Feb. 23, 2006.*
Properties of Borosilicate Glass, Good Fellow, Jun. 15, 2009.*
Corning 0211 Zinc Borosilicate Glass properties.*
Fused Silica, SiO2 glass Properties, Accuratus, 2013.*
Wang et al., "Highly fluorescent quantum dot@silica nanoparticles by a novel post treatment for live cell imaging", RSC Advances, vol. 3, No. 11, Jan. 17, 2013, 4 pages.
Araujo et al., "Structural evolution of a porous type-VI sol-gel silica glass", Journal of Non-Crystalline Solids, Sep. 29, 1994, pp. 41-48.
The extended European search report, corresponding to EP 18152731. 8, dated Jul. 17, 2018, 7 pages.
From the EPO as the ISA, Notification of Transmittal of the International Search Report and the Written Opinion of the International Searching Authority, or the Declaration, corresponding to PCT/EP2019/050951, dated Feb. 12, 2019, 14 pages.

* cited by examiner

*Primary Examiner* — C Melissa Koslow

(57) ABSTRACT

Embodiments of the invention include a transparent material such as glass including a metal such as bismuth, particles of luminescent material such as a nitride phosphor disposed in the transparent material, and a coating disposed over the particles of luminescent material. The coating is formed to prevent reaction between the particles of luminescent material and the metal. The coating may be silica.

12 Claims, 2 Drawing Sheets

COATED WAVELENGTH CONVERTING MATERIAL FOR A LIGHT EMITTING DEVICE

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

A light emitting device such as an LED is often combined with a wavelength converting material such as a phosphor. Such devices are often referred to as phosphor-converted LEDs, or PCLEDs.

SUMMARY

Embodiments of the invention include a transparent material such as glass including a metal ion such as bismuth, particles of luminescent material such as a nitride phosphor disposed in the transparent material, and a coating disposed over the particles of luminescent material. The coating is formed to prevent reaction between the particles of luminescent material and the metal ion. The coating may be silica.

DETAILED DESCRIPTION OF THE PREFERRED EMBODIMENTS

Embodiments of the invention include wavelength converting structures, which may be used with semiconductor light emitting devices such as LEDs. The wavelength converting structures may contain one or more wavelength converting or luminescent materials, and may or may not include other, non-wavelength-converting materials. For economy of language, the wavelength converting materials may be referred to herein as phosphors, though any suitable wavelength converting material may be used, and embodiments of the invention are not limited to phosphors. Accordingly, as used herein, "phosphor" may refer generally to any suitable wavelength converting material or may refer specifically to phosphor. Similarly, for economy of language, the semiconductor device may be referred to herein as an LED, though any suitable light source or semiconductor device may be used, and embodiments of the invention are not limited to LEDs. Accordingly, as used herein, "LED" may refer generally to any suitable semiconductor device or may refer specifically to an LED.

Wavelength converting materials may be formed into a structure that is formed separately from and can be handled separately from the light source, such as a prefabricated glass or ceramic tile, or may be formed into a structure that is formed in situ with the light source, such as a conformal or other coating formed on or above the light source. Sometimes, wavelength converting structures that are formed separately from the light source are preferable, because the light source is not exposed to the conditions required to form the wavelength converting structure (such as, for example, increased pressure or temperature which may damage the light source).

One example of a prefabricated wavelength converting structure is a powder phosphor or other wavelength converting material embedded in glass. Only oxide phosphors such as garnets embedded in a glass matrix are commercially available, because the low melting Bi glasses typically used may react with nitride phosphors, unacceptably reducing the efficiency of the nitride phosphors when embedded in glass. In particular, amine and hydroxyl groups present at the nitride phosphor surfaces may react with Bi(III) under the glass melting conditions, reducing Bi(III) to Bi(0) and forming nitrogen gas. Bi(0) nanoparticles in the glass matrix surrounding the phosphor grains cause discoloration of the glass. Native oxide layers on nitride phosphor particles, or thicker oxide layers generated by, for example, processes claimed in U.S. Pat. No. 8,287,759B2, are not thick or dense enough to act as Bi(III) reduction barriers.

Figure 1:
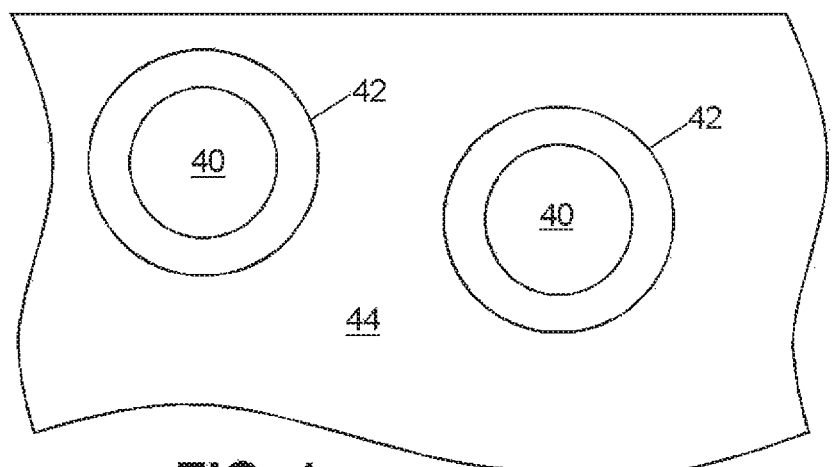
FIG. 1 illustrates two coated wavelength converting particles disposed in a transparent matrix.
Figure 2:
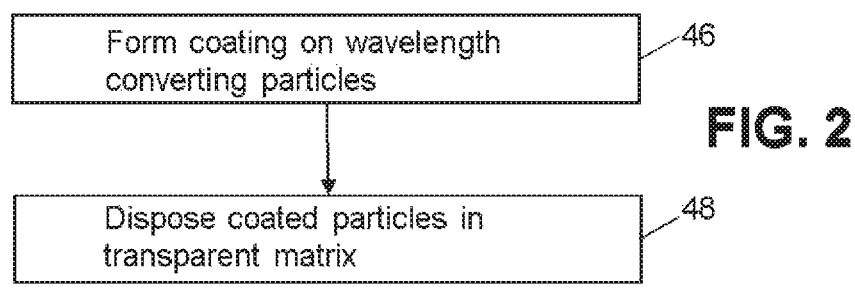
FIG. 2 illustrates a process for forming the structure of FIG. 1.

In embodiments of the invention, particles of a wavelength converting material such as a nitride phosphor are coated with a protective coating and embedded in a transparent matrix such as glass. FIG. 1 illustrates two coated particles disposed in a transparent matrix according to some embodiments. FIG. 1 illustrates a tiny portion of a wavelength converting structure including a wavelength converting material embedded in a transparent matrix. FIG. 2 illustrates a method of forming a wavelength converting structure, according to some embodiments.

In stage 46 of FIG. 2, a coating or shell is formed on wavelength converting particles. The coating may be formed as part of the process for forming the wavelength converting material, or may be formed after the wavelength converting material is formed. Any suitable technique may be used to form the coating. Two coated particles are illustrated in FIG. 1. A coating or shell 42 is formed on wavelength converting particles 40.

Wavelength converting particles may be any suitable wavelength converting material. In some embodiments, the wavelength converting particles are particles of phosphor, in particular nitride phosphor (i.e. phosphor(s) containing nitrogen). In some embodiments, the phosphor is a commercially available nitride phosphors such as, for example, $(Ba,Sr,Ca)_2Si_5N_8$:Eu (BSSNE) or $(Sr,Ca)SiAlN_3$:Eu (SCASN). Any suitable nitride or other phosphor may be used. In powder form, the average particle size (for example, particle diameter) of the phosphor may be at least 1 μm in some embodiments, no more than 50 μm in some embodiments, at least 5 μm in some embodiments, and no more than 20 μm in some embodiments.

Coating 42 prevents particles 40 from reacting with the transparent matrix 44 in which the particles are disposed. For example, when the transparent matrix is glass, coating 42 may prevent particles 40 from reacting with a metal ion, such as Bi, in the glass. In some embodiments, coating 42 is a dense silica shell formed around the nitride phosphor particles. In some embodiments, coating 42 includes one or more oxides of silicon. In some embodiments, coating 42 includes, in addition to or instead of one or more oxides of silicon, one or more binary, ternary or multinary oxides such as $Al_2O_3$, $AlPO_4$, $ZrO_2$ in form of dense, amorphous films or any other suitable form. In some embodiments, the silicon in the silica layer may be partially replaced by, for example, aluminum, boron, germanium, phosphorus, or any other suitable material.

The coating 42 may have a thickness of at least 20 nm in some embodiments, at least 50 nm in some embodiments, no more than 200 nm in some embodiments, and no more than 400 nm in some embodiments. The thickness of coating 42 at various points on the particle may vary less than 50% in some embodiments, and less than 25% in some embodiments.

The coating 42 may have a density of at least 2.1 $g/cm^3$ in some embodiments. While silica shells with densities in the 2.04-2.09 $g/cm^3$ range do not act as good barriers, silica shells with densities of at least 2.1 $g/cm^3$ protect the Bi(III) effectively from being reduced. Silica coatings may have a density of at least 2.13 $g/cm^3$ in some embodiment, at least 2.14 $g/cm^3$ in some embodiments, no more than 2.16 $g/cm^3$ in some embodiments, and no more than 2.15 $g/cm^3$ in some embodiments. Larger densities than 2.16 $g/cm^3$ may render the coating less stable mechanically; a certain amount of mesoporosity in the coating may be beneficial to avoid e.g. cracking of the coating.

In some embodiments, a silica shell 42 is densified at a temperature at least 20K higher in some embodiments and no more than 50K higher in some embodiments than the melting temperature of the transparent matrix (often glass). Densification at elevated temperature may remove reducing components like alcohols, water and ammonia from the silica matrix.

In some embodiments, a silica coating 42 is applied by a sol-gel coating. A coating with an average thickness in the 20-400 nm range, as described above, may be formed by a sol-gel type process in which an inorganic network is formed from a homogeneous solution of precursors by subsequent hydrolysis to form a sol (colloidal suspension) and condensation to then form a gel (cross-linked solid network) that is chemically bonded to the surfaces of the wavelength converting particles. In some embodiments, the coating material is silica and the sol-gel deposition method is the so-called Stöber reacton as described in Stöber, W., A. Fink, et al. (1968). "Controlled growth of monodisperse silica spheres in the micron size range." Journal of Colloid and Interface Science 26(1): 62-69. The luminescent material (i.e. the wavelength converting particles) is dispersed in an alcohol such as an aliphatic alcohol R—OH such as methanol $CH_3OH$, ethanol $C_2H_5OH$ or iso-prop anol $C_3H_7OH$ followed by addition of ammonia ($NH_3$ solution in water) and a silicon alkoxide precursor. The silicon alkoxide precursor dissolves in the alcohol+ammonia mixture and starts to hydrolyze. A conformal silica coating is formed on top of the particle surfaces by reaction of the hydrolyzed, yet dissolved sol species with reactive groups of the particle surfaces (e.g. amine or silanol groups) followed by a seeded growth process that consists of hydrolysis, nucleation and condensation reactions steps.

Figure 3:
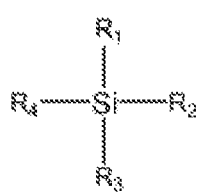
FIGS. 3, 4, 5, 6, and 7 illustrate silicon precursors for forming a silica coating on wavelength converting particles.
Figure 4:
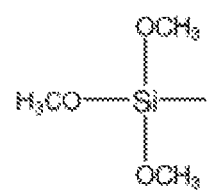
Figure 5:
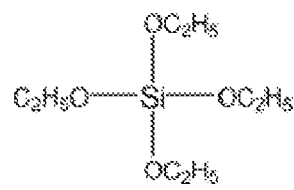
Figure 6:
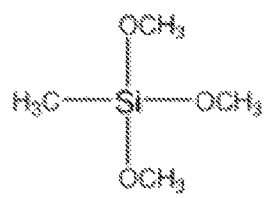
Figure 7:
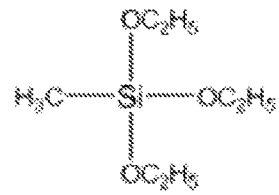

The silicon alkoxide precursor is selected from a group of compounds that is formed by $SiR_1R_2R_3R_4$ (FIG. 3), wherein (a) R1, R2, and R3 are hydrolysable alkoxy groups and R4 is selected from the group of C1-C6 linear alkyl groups, hydrolysable alkoxy groups and a phenyl group, or (b) R1, R2, R3 are individually selected from —$OCH_3$ and —$OC_2H_5$ and R4 is selected from —$CH_3$, —$C_2H_5$, —$OCH_3$, —$OC_2H_5$ and a phenyl group. Examples of suitable silicon precursors include $Si(OCH_3)_4$ (FIG. 4), $Si(OC_2H_5)_4$ (FIG. 5), $Si(CH_3)(OCH_3)_3$ (FIG. 6), and $Si(CH_3)(OC2H_5)_3$ (FIG. 7).

In one example, coating 42 may be formed as follows: (a) the luminescent powder is suspended in an alcohol 31 aqueous ammonia solution mixture. The mixture is stirred and/or sonicated. To improve particle dispersion, the powder can also first be mixed with alcohol and a small amount of a silicon alkoxide before the ammonia solution is added. (b) A silicon alkoxide precursor is added under agitation of the suspension. Typical concentrations of silicone alkoxide, ammonia and water in the alcohol solvent are, for example, 0.02-0.7, 0.3-1.5, and 1-16 mole/l, respectively. (c) The suspension is stirred or sonicated until the coating has formed. (d) The coated powder is washed with alcohol and dried, then calcined in air or vacuum at a temperature that may be higher than the temperature needed to consolidate the phosphor+glass mixture (formed later). The coated powder may be treated at a temperature of at least 450° C. in some embodiments, at least 485° C. in some embodiments, no more than 550° C. in some embodiments, and no more than 515° C. in some embodiments. In a practical example, a silica-coated phosphor powder is heated to 500° C. in air for 30 min.

The inventors observed the density of the silica layer may increase linearly (within experimental errors) as described by the formula: Density $(g/cm^3)$=0.0002 T (° C.)+2.0385. At 500° C. a density of ~2.14 $g/cm^3$ is thus obtained for the silica coating layer.

Returning to FIGS. 1 and 2, in stage 48 of FIG. 2, the coated particles are disposed in a transparent matrix 44. Though the transparent matrix 44 is often glass such as, for example, low melting point bismuth glass or any other suitable glass, any suitable transparent matrix may be used. In some embodiments, the transparent matrix has a high refractive index (for example, >1.6) and a high thermal conductivity (for example, >0.5 W/m K), both compared to, for example, silicone encapsulants. Suitable glasses typically include one or more metals, such as bismuth or any other suitable metal.

In some embodiments, the transparent matrix 44 is Bi-containing low melting point glass. These Bi-containing glasses are preferred for practical application compared to, for example, Zn-phosphate glasses, because of their higher chemical stability and higher refractive index. A $Bi_2O_3$ containing glass matrix 44 generally includes ZnO, $Bi_2O_3$, and $B_2O_3$ as main constituents. The transparent matrix 44 may be for example a low melting glass with a softening point below 1000° C., or any other suitable glass or other transparent material. In some embodiments, the low melting glass belongs to the family of zinc bismuth borate glasses with a softening point below 600° C. and a refractive index larger than 1.75. In some embodiments, the low melting glass may further comprise barium and/or sodium, a softening point below 500° C. and a refractive index larger than 1.8. Embodiments of the invention allows the use of Bi-containing glasses as encapsulants for nitride phosphors. Examples of suitable glass powders produced by Corning are described in U.S. Pat. No. 9,624,124B2. The volume loading of phosphor particles in a glass matrix may be at least 5% in some embodiments and no more than 30% in some embodiments.

In some embodiments, the coated phosphor is disposed in the transparent matrix as follows: Typically, molten glass is powderized by, for example, pouring the glass melt on a metal plate or into cold water followed by crushing and milling of the glass into power form. The glass powder should show a comparable particles size distribution as the phosphor powders, for example in the range 2-30 µm with an average size in the 5-15 µm range. Glass and phosphor powders are then mixed in solvents like water, alcohols, ethers, esters, ketones, aromatic compounds or mixtures thereof. To enhance and stabilize the dispersion, additives like soaps or other dispersants can be added. The dispersion can then be for example slip casted into a porous mold and dried or further mixed with binder system followed by for example tape casting, roll compaction, injection molding, dispensing, printing, spraying or other methods to form dried shapes/bodies/powder compacts. The organic components of the dried powder compacts are then removed in an oxidizing or inert atmosphere. The powder compacts are then heated to a temperature where the glass powder softens and forms a continuous matrix around the phosphor grains The formation of a continuous matrix can be facilitated by for example application of an isostatic or uniaxial external pressure.

The transparent matrix including the coated wavelength converting particles may be formed into a tile by any suitable technique such as, for example casting, molding, or rolling into a sheet, then cutting or otherwise singulating the sheet into individual tiles. Individual tiles may correspond to one or more LEDs or other light sources.

Figure 8:
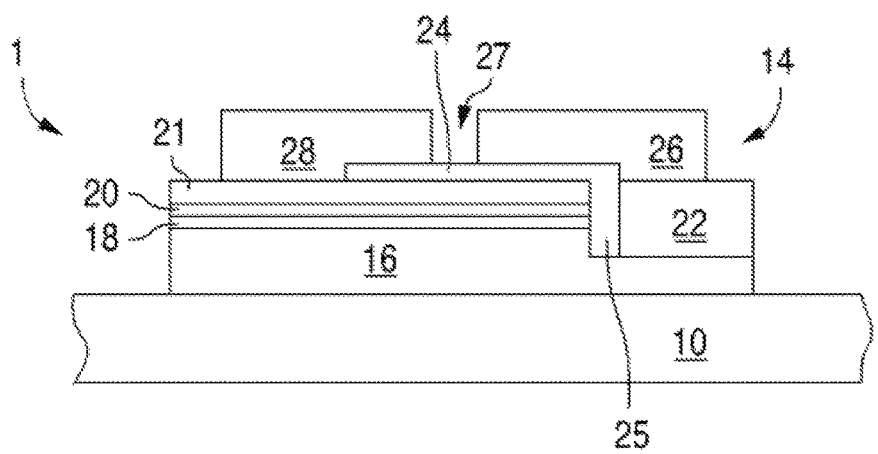
FIG. 8 is a cross sectional view of an LED.

Light emitted by the light source is absorbed by the phosphor according to embodiments of the invention and emitted at a different wavelength. FIG. 8 illustrates one example of a suitable light emitting diode, a III-nitride LED that emits blue light.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used. In particular, the phosphors described above may be pumped by, for example, light sources such as LEDs emitting either in the blue (420-470 nm) or in the UV wavelength range.

FIG. 8 illustrates a III-nitride LED 1 that may be used in embodiments of the present invention. Any suitable semiconductor light emitting device may be used and embodiments of the invention are not limited to the device illustrated in FIG. 8. The device of FIG. 8 is formed by growing a III-nitride semiconductor structure 14 on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple re-contact vias may be formed; the n- and p-contacts 22 and 21 are not limited to the arrangement illustrated in FIG. 8. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 8. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the invention. The invention is not limited to the particular LED illustrated in FIG. 8. The light source, such as, for example, the LED illustrated in FIG. 8, is illustrated in the following figures by block 1.

Figure 9:
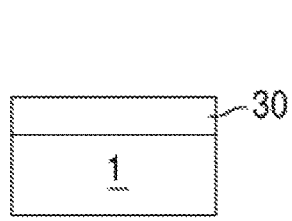
FIG. 9 is a cross sectional view of a device with a wavelength converting structure in direct contact with an LED.
Figure 10:
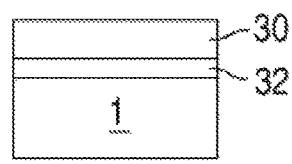
FIG. 10 is a cross sectional view of a device with a wavelength converting structure in close proximity to an LED.
Figure 11:
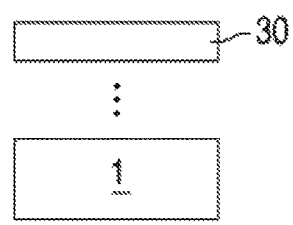
FIG. 11 is a cross sectional view of a device with a wavelength converting structure spaced apart from an LED.

FIGS. 9, 10, and 11 illustrate devices that combine an LED 1 and a wavelength converting structure 30. The wavelength converting structure 30 may be a coated wavelength converting material disposed in a transparent matrix, according to the embodiments and examples described above.

In FIG. 9, the wavelength converting structure 30 is directly connected to the LED 1. For example, the wavelength converting structure may be directly connected to the substrate 10 illustrated in FIG. 8, or to the semiconductor structure, if the substrate 10 is removed.

In FIG. 10, the wavelength converting structure 30 is disposed in close proximity to LED 1, but not directly connected to the LED 1. For example, the wavelength converting structure 30 may be separated from LED 1 by an adhesive layer 2, a small air gap, or any other suitable structure. The spacing between LED 1 and the wavelength converting structure 30 may be, for example, less than 500 µm in some embodiments.

In FIG. 11, the wavelength converting structure 30 is spaced apart from LED 1. The spacing between LED 1 and the wavelength converting structure 30 may be, for example, on the order of millimeters in some embodiments. Such a device may be referred to as a "remote phosphor" device.

The wavelength converting structure 30 may be square, rectangular, polygonal, hexagonal, circular, or any other suitable shape. The wavelength converting structure may be the same size as LED 1, larger than LED 1, or smaller than LED 1.

More than one wavelength converting material may be included in wavelength converting structure 30. For example, multiple wavelength converting materials may be embedded in transparent matrix 44. The wavelength converting materials may be mixed together or formed as separate layers.

The wavelength converting structure 30 may be combined with other wavelength converting layers or structures in a single device. Examples of other wavelength converting structures or layers that may be used include luminescent ceramic tiles; wavelength converting materials such as powder phosphors that are disposed in a transparent material such as silicone that is formed into a flexible sheet, which may be laminated or otherwise disposed over an LED 1, wavelength converting materials such as powder phosphors that are mixed with a transparent material such as silicone and dispensed, screen printed, stenciled, molded, or otherwise disposed over LED 1; and wavelength converting materials that are coated on LED 1 or another structure by electrophoretic, vapor, or any other suitable type of deposition.

As described above, wavelength converting materials besides phosphors may be used, such as, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting materials absorb light emitted by the LED and emit light of one or more different wavelengths. Unconverted light emitted by the LED is often part of the final spectrum of light extracted from the structure, though it need not be. Wavelength converting materials emitting different wavelengths of light may be included to tailor the spectrum of light extracted from the structure as desired or required for a particular application. Examples of suitable combinations for forming white light include blue-emitting LEDs combined with yellow-emitting wavelength converting materials, blue-emitting LEDs combined with red-emitting wavelength converting materials and yellow/green-emitting wavelength converting materials, UV-emitting LEDs combined with blue-emitting wavelength converting materials and yellow-emitting wavelength converting materials, and UV-emitting LEDs combined with blue-emitting wavelength converting materials, yellow/green-emitting wavelength converting materials, and red-emitting wavelength converting materials.

In some embodiments, other materials may be added to the wavelength converting structure or the device, such as, for example, materials that improve optical performance, materials that encourage scattering, and/or materials that improve thermal performance.

EXAMPLES

1. Preparation of Nitride Phosphor.

$(Ba,Sr)_2Si_5N_8$:Eu (BSSNE) phosphor powder is prepared as follows: 56.69 g silicon nitride powder (alpha-$Si_3N_4$, specific surface area 3 $m^2/g$), 1.02 g $Eu_2Si_5N_8$ (prepared by carbothermal reduction and nitridation), 28.32 g $BaH_2$ (>3N5 purity) and 27.33 g $SrH_2$ (>3N5 purity) are ball milled in cyclohexene under nitrogen atmosphere. After drying the mixture is fired twice at 1670° C. for 16 hrs under nitrogen with intermediate milling. The raw phosphor is crushed and ball milled, washed with 0.4N hydrochloric acid and water and dried at 100° C. in air.

2. Silica Coating of Nitride Phosphor.

The phosphor powder of example 1 is first treated in water at 180° C. in a pressure autoclave for 4 hours, washed with 2N hydrochloric acid and water and dried at 100° C. 15 g of the treated phosphor material is than dispersed in 316 g ethanol and 400 µl tetraethylorthosilane (TEOS). After addition of 54.6 g ammonia solution (25%), 12 g TEOS in 192 g Ethanol are slowly added while stirring and sonicating. After stirring for 30 min, the coated phosphor powder is washed with ethanol and dried in vacuum at 300° C.

3. Preparation of a Nitride Phosphor in Glass on Luminescent Ceramic Converter.

6.1 g of the coated phosphor of example 2) is heated for two hours at 500° C. in air. 0.1222 g of the heat treated powder is mixed with 2.3785 g of a bismuth borate powder prepared according to example 71 of U.S. Pat. No. 9,624,124B2 in 40 ml isopropanol by means of a ultrasonic bath. The suspension is sedimented on $(Y,Gd)_3Al_5O_{12}$:Ce dense sintered and polished ceramic wafers of 320 µm thickness by means of a sedimentation vessel filled with isopropanol. After drying of the sedimented phosphor layers, the glass is molten at 530° C. for 30 min (300 K/hr heating and cooling ramps): sample A.

4. Comparative Example Without Silica Coating.

The process of above is carried out except for the silica coating step: sample B.

The table below shows results of the luminescent properties of the bilayer red nitride phosphor in glass on garnet ceramic converter structure. Sample B shows a grey discoloration of the glass matrix while the glass matrix of sample B shows high transparency.

| Sample | Internal QE (%) | CIE x | CIE y | LER (lm/Wopt) |
|--------|-----------------|-------|-------|---------------|
| B | 76 | 0.510 | 0.482 | 394 |
| A | 95 | 0.519 | 0.474 | 389 |

Having described the invention in detail, those skilled in the art will appreciate that, given the present disclosure, modifications may be made to the invention without departing from the spirit of the inventive concept described herein.

Therefore, it is not intended that the scope of the invention be limited to the specific embodiments illustrated and described.

What is claimed is:

1. A wavelength converting structure comprising:
   a transparent material comprising a metal ion;
   particles of luminescent material disposed in the transparent material; and
   a coating disposed over the particles of luminescent material, the coating comprising silica and having a density of from 2.1-2.16 g/cm$^3$ to prevent reaction between the particles of luminescent material and the metal ion.

2. The wavelength converting structure of claim 1 wherein the transparent material is glass and the metal ion comprises bismuth.

3. The wavelength converting structure of claim 1 wherein the luminescent material is a phosphor containing nitrogen.

4. The wavelength converting structure of claim 1 wherein the coating is between 20 and 400 nm thick.

5. The wavelength converting structure of claim 1 wherein the metal ion is Bi(III), the luminescent material is a phosphor comprising one of amine and hydroxyl groups, and the coating is formed to prevent the amine and hydroxyl groups from interacting with the Bi(III) and forming B(0).

6. The wavelength converting structure of claim 1 wherein the coating comprises a material selected from the group consisting of a binary oxide, a ternary oxide, a multinary oxide, $Al_2O_3$, $AlPO_4$, and $ZrO_2$.

7. The wavelength converting structure of claim 1 wherein the coating comprises an oxide comprising a material selected from the group consisting of aluminum, boron, germanium and phosphorus.

8. A method comprising:
   coating particles of phosphor with silica;
   after said coating, heating the coated particles to densify the coating; and
   after said heating, embedding the coated particles in a glass comprising bismuth, wherein the coating is formed to prevent the bismuth from being reduced due to contact with the phosphor.

9. The method of claim 8 wherein coating particles of phosphor comprises using a sol gel process.

10. The method of claim 8 wherein coating particles of phosphor comprises:
    dispersing the particles of phosphor in an alcohol;
    after said dispersing, adding ammonia and a silicon alkoxide precursor; and
    heating the coated particles of phosphor at a temperature of at least 450° C. and no more than 550° C. to densify the coating.

11. The method of claim 8 wherein coating particles of phosphor comprises forming a coating between 20 and 400 nm thick with a density of at least 2.1 g/cm$^3$.

12. The method of claim 8 wherein the phosphor comprises nitrogen.

* * * * *